STEP-RECOVERY MULTIPLIER MODULATOR

Filed Feb. 14, 1966

INVENTOR.
DAVID O. FAIRLEY

BY

Lippincott, Ralls & Hendricson
ATTORNEYS 3,480,882
Patented Nov. 25, 1969

3,480,882

STEP-RECOVERY MULTIPLIER MODULATOR

David O. Fairley, San Jose, Calif., assignor, by mesne assignments, to Automatic Electric Laboratories, Inc., Northlake, Ill., a corporation of Delaware Filed Feb. 14, 1966, Ser. No. 527,025
Int. Cl. H03c 3/02
U.S. Cl. 332—16 4 Claims The present invention relates in general to a step-recovery frequency multiplier which also provides phase modulation in the output thereof. More particularly, the present invention provides a simple frequency multiplier circuit in which a resonant circuit including a step-recovery diode is employed for frequency multiplication, and this diode is simultaneously employed for phase modulating the frequency multiplied output.

It is known to employ PN junction diodes for frequency multiplication, and it is common to utilize so-called varactors in this respect. Commonly, varactor multipliers require a multiplicity of stages including idler circuits for efficient high-order multiplication, and varactor units depend upon reverse bias variation of junction capacitance, with the storage of charge under forward bias being of little importance. On the other hand, step-recovery diodes may be operated to store charge during the forward part of the drive cycle, and return this charge to the circuit during the negative drive, with the diode conductance dropping extremely rapidly at some predetermined point in the negative cycle. The present invention employs this extremely rapid change in diode conductance for highly efficient frequency multiplication, in combination with a tank circuit or resonant circuit, thereby excited at an harmonic of the input frequency. The present invention further provides for utilization of the voltage dependent capacitance characteristic of a step-recovery diode to accomplish phase modulation of the frequency multiplied output signal. A modulation voltage applied across the step-recovery diode hereof produces a capacitance variation over a substantially linear portion of the diode characteristic, to thereby phase modulate the frequency multiplied output. The present invention thus provides for the simultaneous accomplishment of dual objectives in a single, simple system, wherein required intelligence represented by the phase modulation is combined with the frequency multiplication, so as to achieve wide applicability in a variety of fields.

The present invention is illustrated as to one particular preferred embodiment thereof, in the accompanying drawings, wherein.

Before consideration of the invention in detail, it is first noted that the term "step-recovery diode" is herein employed to define a particular type of semiconducting device having a PN junction with certain junction characteristics. Step-recovery diodes are manufactured and marketed by a variety of companies, although a variety of names are employed therefor. As is common in the field of semiconductors, device terminology is somewhat unsettled. Early prototypes of some of these types of diodes were even termed "modified varactors," although this terminology is, at least, in accurate. While PN junction diodes will store charge during forward current flow, step-recovery diodes are optimized for maximum charge storage under the forward current, consistent with a controlled reverse current release of the stored charge and fast transition from reverse current conduction to normal reverse bias condition. Carriers injected into the I-layer interface and stored by diffusion, must be removed by reverse current or recombination before the diode can be turned off or reverse biased into its normal high impedance state. The capacitance or charge storage ability of a step-recovery diode varies with reverse bias, and there is a substantial difference existing in charge storage between forward and reverse diode polarities. In this respect, it is noted that forward charge storage in a typical step-recovery diode may be about ten thousand times greater than in the reverse direction. A conventional step-recovery diode has a high forward current at low forward voltage to thereby permit high charge storage, and a high reverse breakdown voltage to permit high current switching into load impedances of reasonable magnitude. Insofar as harmonic generation is concerned, step recovery diodes may be best rated by the figure M, which is ratio of diode lifetime to transition time. The lifetime is the time for the stored charge to fall to $1/e$ of its initial value in the absense of reverse current, and the transition time is the time for the forward I-layer voltage to drop from ten to ninety percent when the storage charge is exhausted. A high value of M provides for efficient high order harmonic generation. The present invention employs step-recovery diodes as generally identified above. Such diodes are known in the art, and are to be distinguished from varactors.

Figure 1:
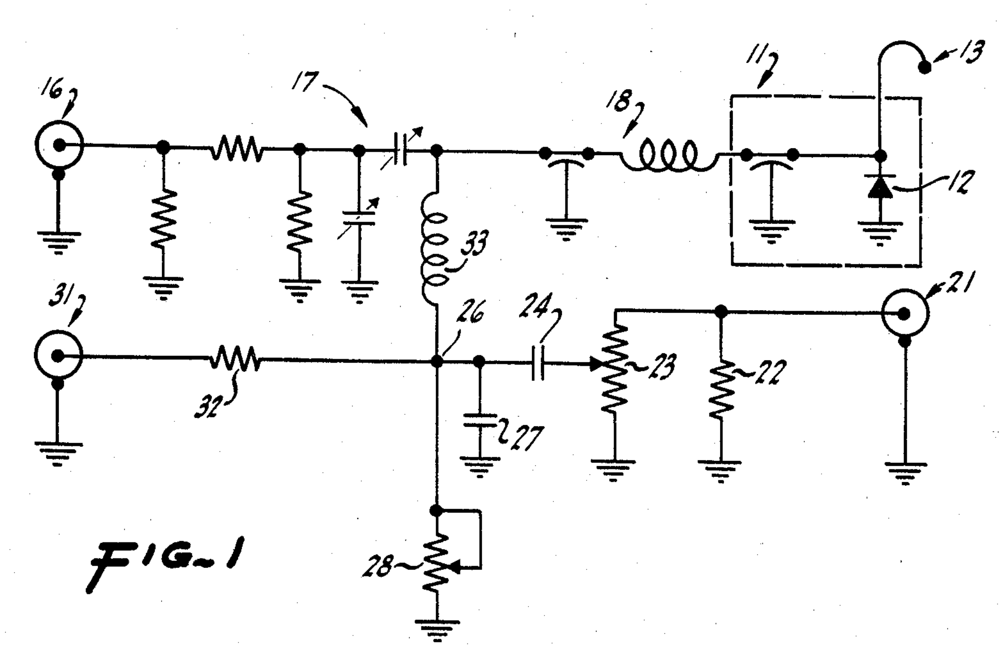
FIGURE 1 is a circuit diagram of an embodiment of the invention.

Referring now to a preferred embodiment of the present invention, as illustrated in FIGURE 1, it will be seen that there is provided a tank circuit or resonant circuit 11 incorporating a step-recovery diode 12, and having an output 13. This tank circuit 11 is fed from an input 16 via input resistors, and through a matching network 17 and a series capacitance-inductance combination 18, serving to prevent high frequency transmission in a reverse direction from the tank circuit. The circuit of FIGURE 1 also includes an additional input terminal 21, which may, of course, come from a transmission line, as schematically illustrated, and this terminal is adapted to receive a modulation voltage input signal. An input resistor 22 extends across the modulation input, i.e., between terminal 21 and ground, and a rheostat 23 is connected in parallel with this input resistor. The rheostat provides a deviation control of the input voltage with the movable contact of the rheostat being coupled through a capacitor 24 to the junction of the matching network 17 and circuit 18, described above. For convenience, a junction point 26 may be identified between the capacitor 24 and the connections thereof to the circuit 18. This junction point 26 is grounded through capacitor 27 and a variable resistor 28 is parallel therewith. If desired, a monitoring terminal 31 may also be connected to this junction point 26 through a coupling resistor 32. No attempt is made in the illustration of FIGURE 1 to illustrate output circuitry of the invention; however, it is to be appreciated that a coupling network of desired characteristics may be employed. The circuit also includes a radio frequency choke 33 between the junction point 26 and the matching network 17, for the purpose of preventing escape of energy at the input frequency.

Figure 2:
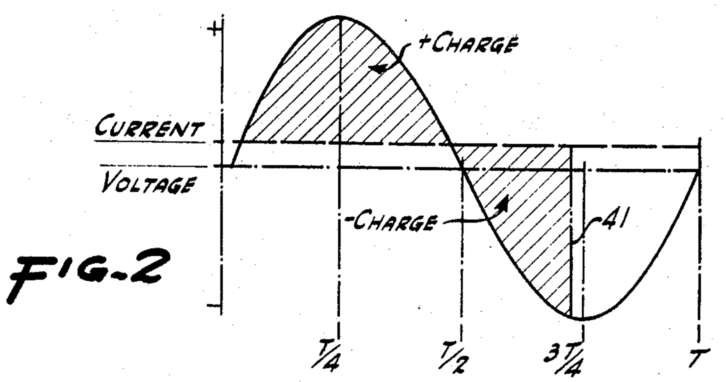
FIGURE 2 illustrates certain step-recovery diode characteristics.

Considering now the operation of the present invention, it is first noted that the diode 12 forms a part of the resonant or tank circuit 11, so that the characteristics of this circuit are in part determined by diode characteristics. In one example, there may be applied to the input 16 a 450 megacycle voltage, which is transmitted to the impedance matching network 17 to the resonant circuit, which may be tuned to resonate at 6300 megacycles. The tank circuit has a very high Q, and is abruptly switched by the step-recovery diode at the input frequency rate, so as to cause the resonant circuit to "ring" at its resonant frequency. Frequency multiplication is thus accomplished by utilization of the step-recovery characteristics of the diode, and in this respect reference is made to FIGURE 2 of the drawing. Although it may not be exactly true, it is sufficient for purpose of description to assume that the input voltage is a sinusoidal signal, as shown in FIGURE 2. With the diode appropriately biased and having a long lifetime compared to the period of the driving signal, all the forward current will be stored in the diode. The charge stored in the diode is then recovered when the current reverses polarities, so that upon dissipation of the stored charge the drive current no longer flows through the diode and flows into the output circuit. The abrupt switching action of the diode is illustrated in FIGURE 2. The cross-hatched portions of the figure illustrate stored charge, and it will be seen that the positive charge stored is equal to the negative charge return to the point of step action of the diode at 41. In the circuit of FIGURE 1, diode biasing may be accomplished by the buildup of charge across capacitor 27 from diode rectified current. The discharge time through resistor 28 being normally longer than the period of the impressed signal at 16 is controlled by adjustment of resistor 28.

The abrupt switching action of the step-recovery diode thus provides for frequency multiplication in the resonant circuit 11. In addition, the present invention provides for phase modulation of this high-frequency signal generated in the resonant circuit. Such phase modulation is herein accomplished by applying a varying voltage to the modulation input terminal 21, and coupling this voltage across the diode 12. In actuality, the magnitude of voltage variation at terminal 21 is relatively small, and is chosen to vary about a D-C level, wherein the diode capacitance variation is substantially linear. Consequently, the modulation voltage causes a substantially linear variation of diode capacitance, to slightly shift the operating point of the diode in accordance with intelligence carried by the modulating voltage. This, then, produces a phase modulation of the high-frequency signal generated in the resonant circuit 11. Consequently, the high-frequency output at terminal 13 is a frequency multiplied version of the input drive voltage at terminal 16, and including phase modulation carrying intelligence in accordance with the modulation voltage applied to input terminal 21. The circuit 18 blocks the return flow of high-frequency signals generated in the resonant circuit, and thus may be considered as a relatively low-pass filter having a cut-off frequency slightly above the frequency of the input drive signal.

Figure 3:
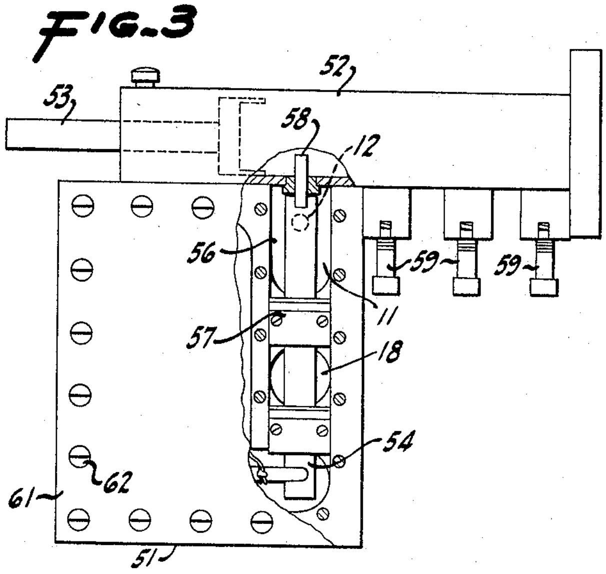
FIGURE 3 is a side view of one preferred physical embodiment of a multiplier modulator in accordance with the present invention.

While it is possible to form the present invention into a wide variety of alternative physical configurations, there is illustrated in FIGURE 3 one example of an actual multiplier modulator in accordance with the present invention. As shown in FIGURE 3, the housing 51 may contain the entire circuitry of the present invention, and be attached to a waveguide termination 52 having end means movable by a plug 53. The housing 51 is illustrated with portions broken away to show the resonant circuit 11, which may actually be formed by an elongated copper strip 54 extending through a cavity 56 with the step-recovery diode 12 connected between this strip and ground at the housing 51. In the illustrated embodiment of the invention, the strip 54 may also extend through an additional cavity to thereby define the filter network 18, and may be held in place, as illustrated, by cross plates 57. The bar 54 includes a probe 58 extending into the interior of the waveguide termination 52 in insulated relationship to the walls thereof, in order to couple output energy into the waveguide. A plurality of tuning plugs 59 may also be provided for conventional purposes in extension into the waveguide termination, as shown. The entire unit of the present invention disposed within the housing 51 may be quite small. The housing may, for example, have dimensions of 2" x 3" x 1" thick, with a removable side plate 61 secured to the remainder of the housing as by bolts 62. In practice, the housing may be formed as a single cast unit with all circuit elements mounted therein upon one side of same, and the plate 61 being subsequently secured to the housing to close same. All adjustments of variable circuit components may thus be readily made from a single side of the housing by conventional means, and the diode 12 may be removably mounted in this same housing side, extending into contact with the conducting strip 54, as illustrated in FIGURE 3. The waveguide termination 52 has a flanged end, so as to be adapted for connection to a waveguide extending therefrom, and carrying high-frequency signals generated by the present invention.

In summary, it is noted that the present invention provides a very simple circuit unit for frequency multiplication and simultaneous phase modulation of the frequency multiplied output signal. Known characteristics of step-recovery diodes are employed in the present invention so that no problems of frequency multiplication are involved and, in fact, the invention described above has proven highly successful in commercial application. By the utilization of a resonant circuit switched with a step-recovery diode, the present invention provides for a highly reliable and advantageous frequency multiplication action, and the present invention takes advantage of the linear voltage-capacitance relationship over a limited portion of the range thereof to accomplish simultaneous phase modulation so as to superimpose intelligence upon the frequency multiplied output of the invention.

Although the present invention has been described above in connection with a single preferred embodiment thereof, it is not intended to limit the invention to the precise terms of the description or details of the illustration, and instead, reference is made to the appended claims for a delineation of the true scope of this invention.

What is claimed is:

1. Apparatus for multiplying the frequency of an alternating current input signal and phase-modulating the frequency multiplied signal, said apparatus comprising, in combination, a resonant circuit including a step-recovery semiconductor diode having a much higher charge storage capability in the forward direction than in the reverse direction, input means connected to said resonant circuit for coupling an alternating current input signal of first frequency to said resonant circuit, said input signal causing said diode to switch thereby causing said resonant circuit to resonate and to generate signals of a frequency which is a multiple of said first frequency, an output circuit coupled to said resonant circuit, and means for applying a modulating voltage across said diode to thereby phase modulate the frequency multiplied signals at said output circuit.

2. The apparatus of claim 1, further defined by means forward biasing said diode at a voltage less than the voltage swing of input signal, and said modulation voltage being superimposed upon said diode bias with a magnitude of amplitude variation producing only a substantially linear diode capacitance variation.

3. The apparatus of claim 1, further characterized by said resonant circuit having a resonant frequency that is a harmonic multiple of said first frequency, a low-pass filter coupling said input to said resonant circuit, a self-biasing circuit coupled to said input means and to said resonant circuit, and a variable resistance circuit coupling said modulation voltage across said diode.

4. The multiplier modulator of claim 1, further characterized by said diode having a large M value of lifetime to transition time for maximized switching speed.

References Cited

UNITED STATES PATENTS 3,324,414 6/1967 Numakura -------- 307—88.5 X

(Other references on following page)

OTHER REFERENCES

Strickholm — "Designing Varactor-Tuned Circuits," Electronics Industries, pp. 72–75, August 1965.

Moll—"P-N Junction Charge-Storage Diodes"—Proceedings of the IRE pp. 13–51, January 1962.

ROY LAKE, Primary Examiner
L. J. DAHL, Assistant Examiner

U.S. Cl. X.R.

307—19; 332—30